United States Patent [19]

Hsu

[11] Patent Number: 5,430,318
[45] Date of Patent: Jul. 4, 1995

[54] BICMOS SOI STRUCTURE HAVING VERTICAL BJT AND METHOD OF FABRICATING SAME

[75] Inventor: Sheng T. Hsu, Vancouver, Wash.

[73] Assignees: Sharp Microelectronics Technology, Inc., Camas, Wash.; Sharp Kabushiki Kaisha, Osaka, Japan

[21] Appl. No.: 76,569

[22] Filed: Jun. 14, 1993

[51] Int. Cl.⁶ .............................................. H01L 27/02
[52] U.S. Cl. ..................................... 257/370; 257/350; 257/378; 257/51; 257/67
[58] Field of Search ............... 257/370, 350, 378, 588, 257/51, 67

[56] References Cited

U.S. PATENT DOCUMENTS

| 4,016,596 | 4/1977 | Magdo et al. ............. | 257/370 |
| 4,980,303 | 12/1990 | Yamauchi ................. | 257/378 |
| 5,079,607 | 1/1992 | Sakurai ................... | 257/378 |
| 5,102,809 | 4/1992 | Eklund et al. ............. | 257/370 |
| 5,212,397 | 5/1993 | See et al. ................ | 257/350 |
| 5,331,193 | 7/1994 | Mukogawa ................. | 257/378 |
| 5,355,009 | 10/1994 | Honda et al. .............. | 257/378 |

FOREIGN PATENT DOCUMENTS

| 0135723 | 3/1983 | Japan | 257/378 |
| 61-67253 | 4/1986 | Japan | 257/370 |
| 62-35556 | 2/1987 | Japan | 257/350 |
| 1251749 | 10/1989 | Japan | 257/378 |

*Primary Examiner*—Mark V. Prenty
*Attorney, Agent, or Firm*—Fliesler, Dubb, Meyer and Lovejoy

[57] ABSTRACT

A BiCMOS structure in which the bipolar transistor is preferably arranged vertically and the MOS transistors are formed on insulator. SIMOX techniques may be used to form a starting substrate.

7 Claims, 2 Drawing Sheets

BICMOS SOI STRUCTURE HAVING VERTICAL BJT AND METHOD OF FABRICATING SAME

BACKGROUND OF THE INVENTION

1. Technical Field

The present invention relates to BiCMOS structures.

2. Description of the Related Art

BiCMOS structures consist of at least two MOS transistors and one bipolar transistor (BJT). Their inception has come about in an attempt to take advantage of the beneficial aspects of MOS and bipolar devices and their use is becoming increasingly prevalent.

Beneficial aspects of MOS devices include that MOS processing techniques yield high packing densities and MOS devices generally operate on less current than functionally analogous bipolar devices. A limitation of MOS devices is that they have poor current driving capabilities.

Beneficial aspects of bipolar devices include that while being more difficult to isolate and taking up more space than analogous MOS devices, they provide good current driving capabilities and attain higher operating frequencies than MOS transistors. Certain bipolar transistor structures such as a vertical BJT are capable of operating, at present standards, at approximately 80 Gigahertz (GHz). Laterally arranged bipolar transistors operate at approximately 10 GHz.

BiCMOS structures are currently used in SRAM and DRAM chips. In such circuits, MOS transistors are used to form memory cells and bipolar transistors are used for driving signals onto buses and other high capacitance loads. BiCMOS structures are also used in logic arrays for related purposes.

Another application of BiCMOS structures is in circuits such as A/D and D/A converters. In these circuits, both transistor types are integrated to produce a more accurate and more rapid conversion. The developing field of digital signal processing is a growing field of BiCMOS implementation.

Referring now to performance considerations, the performance of MOS transistors is impeded by parasitics, such as parasitic capacitance and parasitic resistance, that combine to form a time constant ($\tau$) which reduces the maximum operating frequency of an MOS transistor.

With respect to bipolar transistor (which as stated above may be arranged either laterally or vertically), laterally arranged bipolar transistor have a large series resistance due to the thin silicon film from which they are made. This large series resistance adversely impacts operating frequency. By comparison, vertically arranged bipolar transistors have operating frequencies approximately one order of magnitude greater than that of laterally arranged bipolar transistor and, therefore, their use is generally preferred.

The present invention is directed towards enhanced performance in BiCMOS structures.

SUMMARY OF THE INVENTION

The present invention discloses a method fox forming a BiCMOS structure which includes the steps of providing or forming a semiconductor substrate which has a buried insulation layer formed between bulk semiconductor material and a surface layer of semiconductor material. Shallow SIMOX techniques are preferably used to form this substrate. MOS transistors are formed in the surface layer of semiconductor material and the bipolar transistor is arranged vertically such that at least one of the emitter and collector of the bipolar transistor is formed in the bulk semiconductor material. Additional semiconductor material is formed over the substrate, preferably by deposition, and the gate electrode and the other of the emitter and collector are formed of this additional layer of semiconductor material. The additional layer of semiconductor material may be deposited such as through chemical vapor deposition (CVD), and it may be polysilicon.

MOS transistors are formed in the surface layer of semiconductor material by etching the surface layer to form islands. These islands are then doped to form source and drain regions separated by a channel region. A thin layer of oxide material is provided over each islands to form a gate oxide therefor and gate electrodes are then formed over the gate oxide.

The formation of the bipolar transistor may include defining and doping a base and a collector in the bulk layer of semiconductor material, forming a layer of oxide over the base region and selectively etching the oxide to expose a portion of the base. Additional semiconductor material, such as polysilicon, is formed over the exposed base and then etched to define the emitter of a vertically arranged bipolar transistor. Note that the emitter and collector in the example of this paragraph could be reversed by one of ordinary skill in the art depending on a specific implementation of the bipolar transistor.

In a preferred fabrication process, the emitter (or the one of the emitter and collector not formed in the bulk layer of semiconductor material) and the gate electrode of the MOS transistor are formed in the same process steps. These process steps include the deposition of polysilicon material and the etching of the deposited polysilicon material to define the gate electrode and the emitter.

In addition to providing a method for forming a BiCMOS structure, the present invention includes the BiCMOS structure formed by the method. Such a semiconductor structure has a bulk layer of semiconductor material overlayed with a layer of insulator material which, in turn, is overlayed with a surface layer of semiconductor material. An MOS transistor is formed substantially in the surface layer of semiconductor material. A vertically arranged bipolar transistor is formed such that a base and one of the emitter and collector is formed in the bulk layer of semiconductor material. The other of the emitter and collector is formed in communication with the base, but not in the bulk layer of semiconductor material. The other of the emitter and the collector is preferably formed of deposited semiconductor material, such as polysilicon. The gate electrode of the MOS transistor is also preferably formed of deposited polysilicon and it is further preferred, that the gate electrode is formed in the same process steps which form the other of the emitter and the collector.

Other aspects of the present invention will be appreciated upon review of the following detailed description with reference to the Drawings.

DETAILED DESCRIPTION

Figure 1:
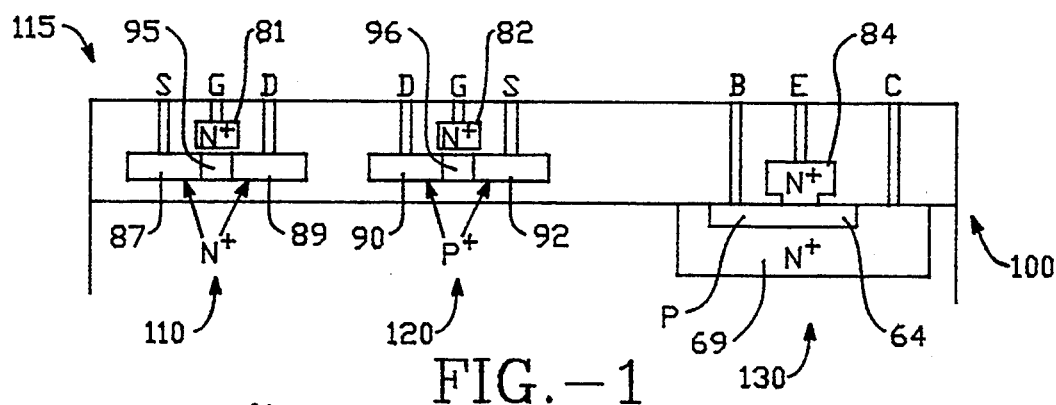
FIG. 1 is a cross-sectional view of a BiCMOS structure formed by the process described with reference to FIGS. 2-8.

Referring to FIG. 1, a cross-sectional view of a BiCMOS structure 100 is shown. This BiCMOS structure 100 is fabricated following a process described below with reference to FIGS. 2–8. To facilitate a more thorough understanding of the present invention, a description of the completed semiconductor structure 100 is presented first followed by a description of the process steps used to fabricate same. A description of an alternative BiCMOS structure follows thereafter.

The BiCMOS structure 100 comprises a CMOS device, including an n-channel MOS transistor 110 and a p-channel MOS transistor 120, and a bipolar transistor 130. Each of the MOS transistors 110, 120 has a source 87, 92 and drain 89, 90 region and a gate electrode 81, 82. A channel region 95, 96 is formed between the source and drain regions. The bipolar transistor 130 has an emitter 84, base 64 and collector 69.

In a preferred embodiment, the bipolar transistor 130 is an n-p-n, vertically arranged transistor. A vertically arranged bipolar transistor is capable of faster operation than a laterally arranged bipolar transistor. If desired, the bipolar transistor 130 could alternatively be configured as a p-n-p bipolar transistor.

The emitter (or collector) of the vertically arranged bipolar transistor is formed from a deposited semiconductor material such as polysilicon. This provides several benefits which include enhanced electrical properties at the emitter-interconnect junction and rapid, cost-effective fabrication.

To reduce parasitic capacitance, the MOS transistors 110 and 120 are formed on an insulator 52 such as silicon dioxide. This reduces the size of the junction areas between the channel regions 95, 96 and the source 87, 92 and drain 89, 90 regions. Since parasitic capacitance and leakage current are proportional to the size of these junction areas, a reduction in their size results in a reduction in parasitic capacitance and leakage (or standby) current.

Another consideration in maximizing operating frequency is reducing the base width of the bipolar transistor 130. Reductions in the base width are known to bring about favorable increases in operating frequency. For that reason, the base 64 is made shallow. The approximate thickness of the base is in the range of 400 Å to 1000 Å.

It is important to note that the dimensions of the structure 100 and the individual components therein are not drawn in exact proportion, but are presented for illustrative purposes.

Figure 2:
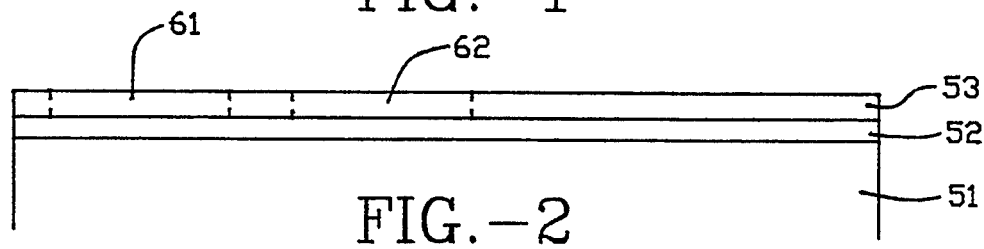
FIGS. 2-8 are cross-sectional views of a BiCMOS structure at various stages of its fabrication process.

Referring to FIG. 2, a cross-section of a portion of a semiconductor wafer 50 is shown. This cross-section is comprised of a substrate 51 of semiconductor material such as silicon, or the like, a layer of insulator material 52 such as silicon dioxide, sapphire, magnesium aluminate spinal, or the like, and a surface layer of semiconductor material 53. The fabrication of other silicon on insulator (SOI) structures, such as silicon on sapphire, is known in the art. SOI structures are also available commercially.

In a preferred embodiment, the wafer structure 50 is fabricated using silicon implanted oxygen (SIMOX) techniques because of the several advantages provided thereby. In this case, the substrate 51 and surface layer 53 comprise single crystal silicon and the insulator material 52 comprises silicon dioxide. A preferred thickness of surface layer 53 and silicon dioxide layer 52 is approximately 500 Å each.

A suitable process using SIMOX techniques to form the structure of FIG. 2 is as follows. An oxygen ion dose of approximately $1 \times 10^{17}$ to $5 \times 10^{17}$ ions/cm$^2$ is implanted into the silicon substrate. This oxygen ion implantation can be done with a low energy, high current (5 to 20 mA) ion implanter. The substrate is then annealed at a temperature preferably between 1300° C. and 1350° C. for 1 to 3 hours to form 0.05 to 0.1 μm of buried oxide. The advantages of using SIMOX technology include that wafer may be fabricated from silicon which is readily available and further that the fabrication process consumes less power than conventional fabrication techniques.

Proceeding with this structure, photoresist (not shown) is applied to the silicon layer 53 and an etch of layers 53 is performed to create silicon islands 61 and 62. These island are indicated by dashed lines in FIG. 2.

Figure 3:
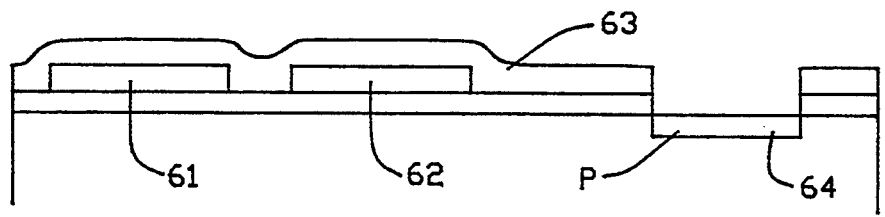

Referring to FIG. 3, the silicon islands 61 and 62 are covered with photoresist 63 as shown and an oxide etch is performed to expose a portion of the substrate 51. The photoresist 63 is then removed.

In a next step, all portions of the structure of FIG. 3 are protected by photoresist (not shown), except for island 61 (which will subsequently become an n-channel MOS transistor) and an ion implantation is undertaken to provide a proper threshold voltage adjustment. The photoresist is then stripped. Suitable threshold voltage adjustment is known in the art and may be achieved in the present case for an n-channel device having an N+ gate electrode (described below) by implanting a dose of boron ions in the range of $5 \times 10^{11}$ to $10^{13}$ ions/cm$^2$ at an energy of 10 to 20 keV. Photoresist is stripped and a similar process is followed to provide proper threshold voltage adjustment in island 62 (which will subsequently become a p-channel MOS transistor). Suitable threshold voltage adjustment for a p-channel MOS transistor having N+ gate may be achieved through a boron ion implantation in a dose of approximately $5 \times 10^{11}$ to $10^{13}$ ions/cm$^2$ at an energy of 5 to 15 keV. Other materials are available for doping and concentrations may vary based on gate electrode doping and other parameters, known in the art.

In a next step, photoresist (not shown) is applied and an ion implantation is made to create base 64 of the bipolar transistor. The photoresist is then stripped.

The base 64 can be either n or p doped, depending on the ultimate application of the BiCMOS device. In a preferred embodiment, the base 64 is p doped and a suitable ion implantation for p doping is a dose of boron ions in the order of $10^{12}$ to $10^{13}$ ions per/cm$_2$ and at an energy of 10 to 20 keV.

Figure 4:
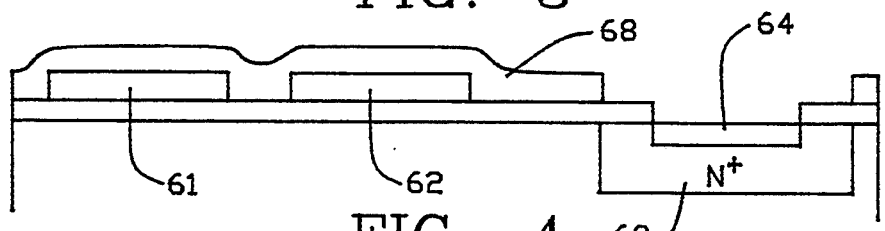

Referring to FIG. 4, photoresist 68 is applied to the structure of FIG. 4 as shown and an ion implant is undertaken to form the collector 69 of a bipolar transistor. In a preferred embodiment, the implantation is performed at high energy and using phosphorous ions implanted at a concentration of 1 to $5 \times 10^{15}$ ions/cm$^2$ at an energy of 100 to 200 keV. Phosphorous ion implantation is used instead of arsenic ion implantation because a deep diffusion is desired and phosphorous dopant impurities are characterized as diffusing more readily than arsenic dopant impurities.

Figure 5:
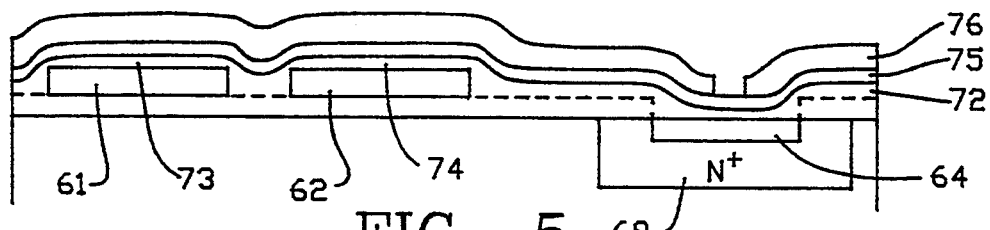

Referring to FIG. 5, a layer of oxide 72 is formed. A first portion 73 of this layer will form the gate oxide over silicon island 61 and a second portion 74 will form gate oxide layer over silicon island 62. One method of forming the oxide layer 72 is through thermal growth in which the oxide is grown in an environment of gaseous oxygen. The approximate thickness of oxide layer 72 is from 50 to 150 Å.

Figure 6:
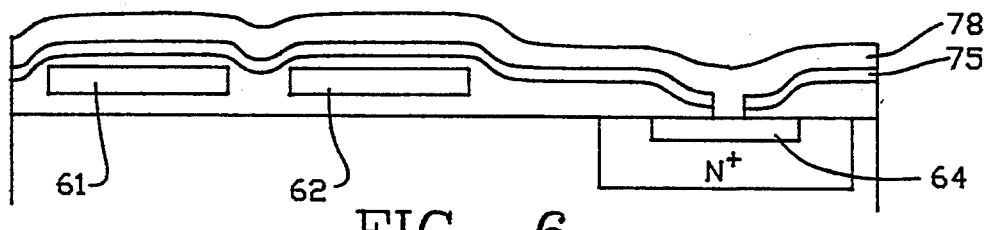

Polysilicon 75 is then deposited onto the gate oxide 72. The polysilicon layer 75 is created using chemical vapor deposition (CVD) and has a thickness of approximately 100 to 500 Å. This layer of polysilicon functions essentially as a protective layer for protecting the thin gate oxide layer 72 from the harmful effects of chemicals used in photoresist related processing, which may cause oxide breakdown. Photoresist 76 is then applied to the semiconductor structure of FIG. 5 to define an emitter in contact with the base region. An etch is then performed of a portion of the polysilicon layer 75 and the oxide layer 72 to expose the base 64 as illustrated in FIG. 6. The p-n junction between the base and subsequently formed emitter will be formed at this exposed portion.

Referring to FIG. 6, a layer of polysilicon 78 having a thickness of approximately 1,000 to 3,000 Å is created through chemical vapor deposition (CVD) techniques. This layer of polysilicon 78 merges with the existing layer of polysilicon 75, but is shown separately in FIG. 6 to illustrate the two different process steps required for their formation. Ion implantation to appropriately dope what will be the gate electrodes of the MOS transistor and the emitter of the bipolar transistor is then performed. In a preferred embodiment, arsenic ions are implanted with an ion dose in the range of $5 \times 10^{15}$ to $2 \times 10^{16}$ ions per cm$^2$ at an energy of 20 to 60 keV. Note that arsenic ions are preferred to phosphorus ions, in this instance, because they diffuse more slowly and, therefore, the extent of their diffusion can be more readily controlled. Note also that p doping could alternatively be performed if a p doped gate electrode is desired. In this case, the bipolar transistor would be a p-n-p transistor if no extra processing steps are to be performed. If a p-n-p transistor is indeed implemented, the base 64 and collector 69, described above, must be doped with negative and positive dopant impurities, respectively.

Figure 7:
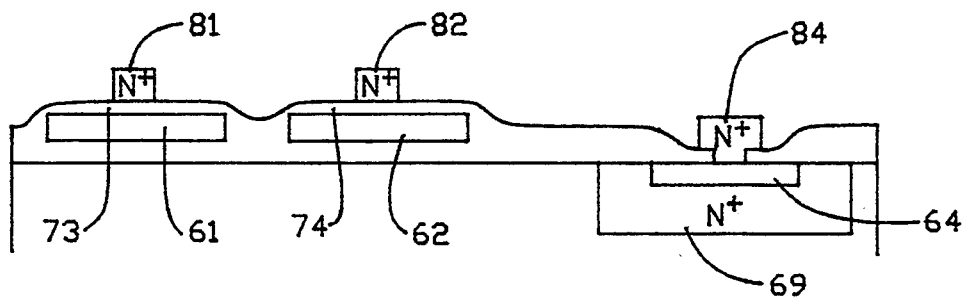

Referring to FIG. 7, appropriate photoresist (not shown) is applied to the polysilicon layer 78 to define gate electrodes for the MOS transistors and an emitter for the bipolar transistor. A polysilicon etch is then performed to create gate electrodes 81 and 82 and emitter 84 as shown. Each of these newly created electrodes are N+ doped because of the arsenic ion implantation described immediately above.

Figure 8:
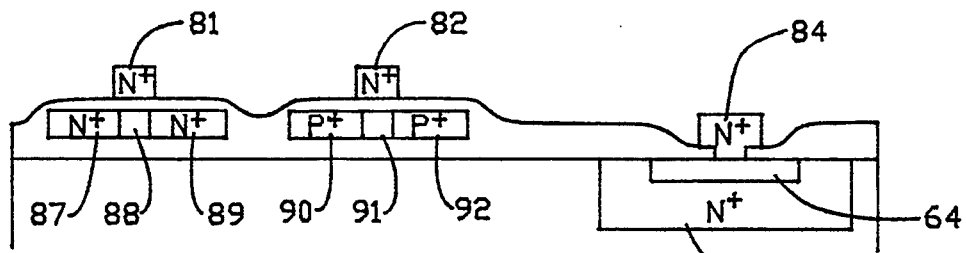

Referring to FIG. 8, steps are now taken to form the source and drain regions of the MOS transistors and the collector contact region and base contact region of the bipolar transistor. Photoresist (not shown) is applied to all portions of the structure of FIG. 8, except those regions which will receive negative dopant impurities to form negatively doped source and drain regions. A negative ion implantation is then performed in which, in a preferred embodiment, a dose of arsenic ions in the range of $1 \times 10^{15}$ to $5 \times 10^{15}$ ions per cm$^2$ at an energy of 30 to 70 keV is implanted. The N+ doped regions 87 and 89 are thereby formed. The photoresist is stripped and new photoresist (not shown) is applied to all areas of the wafer which will not receive positive dopant impurities. An implantation of positive dopant impurities is then performed in which, in a preferred embodiment, boron difluoride ions (BF$_2$) are implanted in a dose in the range of $1 \times 10^{15}$ to $5 \times 10^{15}$ ions per cm$^2$ at an energy of 30 to 70 keV. The photoresist is then stripped. Photolithography and doping techniques to form source and drain regions are known in the art.

An RTA in nitrogen ambient at 1050° to 1100° C. for 10 to 20 second, or longer, is then performed to stabilize the structure of FIG. 8.

Referring to FIG. 1, state of the art processes are performed to complete the BiCMOS structure. These include the chemical vapor deposition of oxide, or the like, to insulate various components of the CMOS structure 115 and bipolar transistor 130, a contact via etch to obtain access to the source, gate and drain regions of the MOS transistors 110, 120 and to the base, emitter and collector of the bipolar transistor 130 and the metallization of those contact holes to form high conduction interconnects. The completed BiCMOS structure 100 is shown in FIG. 1.

Figure 9:
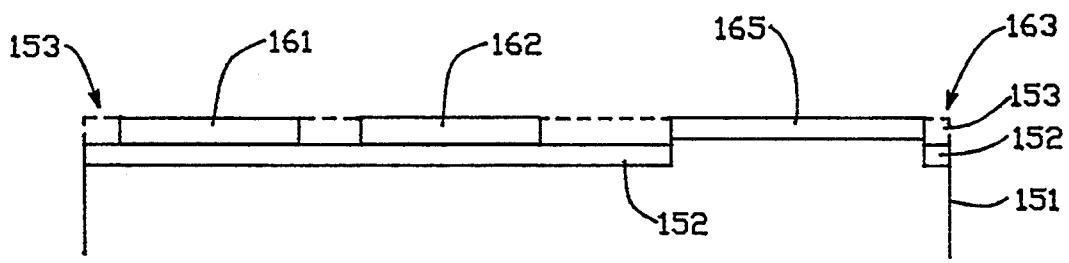
FIGS. 9–10 are cross-sectional views of a preliminary and a final stage, respectively, of an alternative embodiment of a BiCMOS structure.
Figure 10:
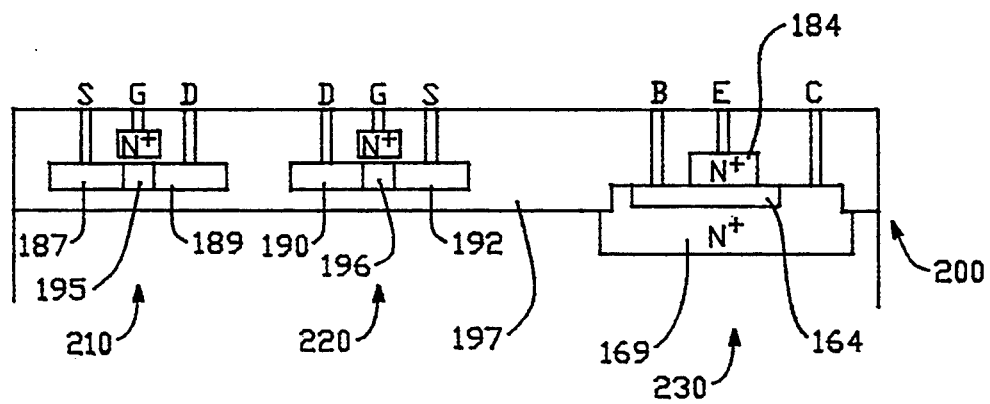

Referring to FIG. 9, a starting silicon wafer structure 151 is shown for an alternative BiCMOS structure 200 (of FIG. 10). Among other features, an aspect of the starting wafer of FIG. 9 is that a portion of the wafer in which a base will subsequently be formed is protected by a thin layer of oxide and a layer of photoresist before an oxygen ion implant to form the buried oxide layer is performed. Note that the layer of oxide and photoresist could be replaced by a sole layer of photoresist, although the additional protection afforded by the oxide/photoresist combination is preferred. By protecting the base region with a thin layer of oxide and photoresist (or with a layer of photoresist only), the smoothness of the original silicon crystal surface is substantially maintained. A smooth surface is beneficial in defining fine patterns because variations in the focal length of photolithographic equipment results in lines of varying widths. A surface variation of ¼ or ½ of a micron may be significant. A fabrication process beginning with the wafer of FIG. 9 is now described.

A portion of a semiconductor wafer indicated by the dashed line and the solid, exterior lines of the initial substrate 151 is covered by approximately 100 to 300 nm of oxide (not shown), or the like. Photoresist is then applied to the oxide in alignment with a portion 163 which will subsequently comprise a substantial portion of a bipolar transistor. An etch of the exposed oxide is then performed to produce a substrate in which those portions indicated by the dashed line and those forming the top surface of islands 161 and 162 are exposed, while the portion 163 remains covered by a layer of oxide and photoresist. Using shallow SIMOX techniques, an oxygen ion implantation is made into this structure to created a buried layer of oxide 152. A suitable oxygen implantation for this purpose is a dose of oxygen ions in the range of 1 to $5 \times 10^{17}$ ion per cm$^2$ at an energy of 20 to 40 keV. The layer of photoresist (not shown) is then stripped.

The resulting structure is a semiconductor substrate of silicon with a buried layer of silicon dioxide 152 and a surface layer of silicon 153. The portion 163 overlayed with oxide (not shown) is formed adjacent thereto. The thickness of the surface silicon layer 153 and the silicon dioxide layer 152 are each approximately 500 Å. This structure is annealed at approximately 1300° to 1350° C. for 1 to 3 hours.

Following the anneal, the oxide on portion 163 is removed and then photoresist is applied to define islands 161 and 162 and to protect the portion 163. An etch of the surface silicon layer 153 is then performed to isolate islands 161, 162 and the bipolar portion 163.

In a next step, appropriate threshold voltage adjustment is provided to the silicon islands 161, 162; and base dopant impurities are implanted into the portion 163 as indicated by line 165 to provide dopant impurities for a base region 164 to be defined subsequently. Threshold voltage adjustment and base dopant impurities are discussed above with reference to FIG. 3.

Referring to FIG. 10, a finished BiCMOS structure 200 fabricated from the substrate structure of FIG. 9 is shown. This finished structure 200 is formed starting with the substrate described with reference to FIG. 9 and following the process steps described above with reference to FIGS. 4–8. Appropriate finishing steps, as described with reference to FIG. 1, may be used to complete the structure 200.

The BiCMOS structure 200 contains an n-channel 210 and a p-channel 220 MOS transistor and a bipolar transistor 230. The n-channel MOS transistor 210 has a source 187 and a drain region 189 separated by a channel region 195. The p-channel MOS transistor 220 similarly has a source 190 and a drain region 192 separated by a channel region 196. Both of these transistors 210, 220 are insulated by oxide 197, or another suitable insulator.

The bipolar transistor 230 has a collector 169, a base 164 and an emitter 184. As discussed above, there are several variations of bipolar and MOS transistors. Modifications with respect to the concentration and polarity of dopants, the physical layout or arrangement of each transistor and the designation of source and drain regions are included within the scope of the present invention.

Referring to both of the BiCMOS structures 100 and 200, their simultaneous fabrication of MOS and bipolar transistors as taught above realizes several benefits which, in addition to the solid-state physical benefits, include reduced power consumption and processing time and the use of less expensive and readily available raw materials.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

I claim:

1. A BiCMOS structure, comprising:
   a substrate having a surface layer of semiconductor material, a buried insulation layer and a bulk layer of semiconductor material;
   an MOS transistor having a channel region formed in said surface layer; and
   a vertically arranged bipolar transistor having an emitter, base and collector, at least one of said emitter and collector formed in said bulk layer; wherein said MOS transistor includes a gate electrode and said gate electrode and the other of said emitter and collector are formed of an additional layer of semiconductor material.

2. A BiCMOS structure, comprising:
   a bulk layer of semiconductor material;
   a layer of insulator formed on said semiconductor material;
   a layer of semiconductor material formed on said layer of insulator, said insulator having an opening therethrough;
   an MOS transistor formed in said layer of semiconductor material; and
   a vertically arranged bipolar transistor having an emitter, base and collector, wherein one of said emitter and collector is formed in said bulk layer, said base is formed in said bulk layer adjacent said opening and the other of said emitter and collector is formed in said opening and adjacent to said base.

3. The BiCMOS structure of claim 2, wherein the other of said emitter and collector comprises polysilicon.

4. The BiCMOS structure of claim 2, wherein said insulator material is silicon dioxide formed by SIMOX techniques.

5. The BiCMOS structure of claim 1, wherein said additional layer comprises polysilicon.

6. The BiCMOS structure of claim 1, wherein said surface layer and said insulation layer are formed by SIMOX techniques.

7. A BiCMOS structure, comprising:
   a substrate of semiconductor material having a surface layer of semiconductor material, a buried insulation layer and a bulk layer of semiconductor material;
   an MOS transistor having a channel region formed in said surface layer; and
   a vertically arranged bipolar transistor having an emitter, base and collector, at least one of said emitter and collector formed in said bulk layer;
   wherein the other of said emitter and collector comprises polysilicon.

* * * * *

UNITED STATES PATENT AND TRADEMARK OFFICE
CERTIFICATE OF CORRECTION

PATENT NO. : 5,430,318
DATED : July 4, 1995
INVENTOR(S) : Sheng T. Hsu

It is certified that error appears in the above-indentified patent and that said Letters Patent is hereby corrected as shown below:

Column 2, line 16, after "oxide" delete "therefor" and insert --therefore--;
Column 4, line 21, after "These" delete "island" and insert therefor --islands--;
Column 5, line 2, before "gate" insert --a--;
Column 6, line 7, after "20" delete "second" and insert therefor --seconds--;
Column 6, line 52, after "structure to" delete "created" and insert therefor --create--.

Signed and Sealed this

Twelfth Day of March, 1996

Attest:

BRUCE LEHMAN

*Attesting Officer*      *Commissioner of Patents and Trademarks*